United States Patent [19]
Markman et al.

[11] 4,056,406
[45] Nov. 1, 1977

[54] TUBULAR THERMOELECTRIC MODULE

[76] Inventors: Mikhail Abramovich Markman, ulitsa Shirokaya, 1, korpus 2, kv. 264; Leonid Mikhailovich Simanovsky, ulitsa 3 Mytischinskaya, 14, kv. 18; Igor Rostislavovich Jurkevich, Michurinsky prospekt, 74, kv. 116; Nikolai Vasilievich Kolomoets, Kastanaevskaya ulitsa, 61, korpus 1, kv. 22, all of Moscow; Vyacheslav Tikhonovich Kamensky, Sovetsky prospekt, 26, kv. 112, Ivanteevka Moskovskoi oblasti; Igor Mikhailovich Matskov, ulitsa Festivalnaya, 22, korpus 3, kv. 263; Sergei Ilich Maximov, ulitsa Shirokaya, 24, kv. 26, both of Moscow, all of U.S.S.R.

[21] Appl. No.: 541,322

[22] Filed: Jan. 15, 1975

[51] Int. Cl.² .............................................. H01L 35/02
[52] U.S. Cl. .................................... 136/208; 136/221; 136/225
[58] Field of Search ................ 136/208, 221, 224, 225

[56]     References Cited
U.S. PATENT DOCUMENTS
3,326,727   6/1967   Fritts ...................................... 136/208

FOREIGN PATENT DOCUMENTS
874,660   8/1961   United Kingdom ................. 136/208

Primary Examiner—Maynard R. Wilbur
Assistant Examiner—Richard E. Berger
Attorney, Agent, or Firm—Haseltine, Lake & Waters

[57] ABSTRACT

A tubular thermoelectric module used primarily as a part of thermoelectric generators, comprising an inner thermal conductor with circular thermopiles embracing the inner thermal conductor, and with strips serving to interconnect the thermopiles; an outer thermal conductor in the form of several sealed taper clamps, each embracing a circular thermopile; and electric insulation units which insulate one thermopile from another and from the inner and outer thermal conductors.

7 Claims, 5 Drawing Figures

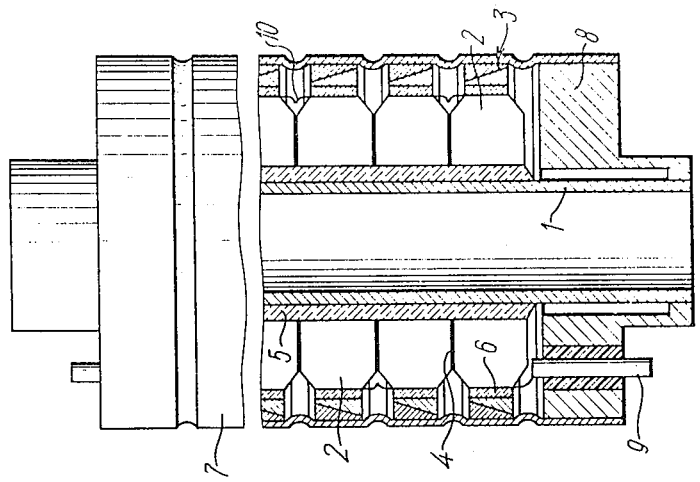
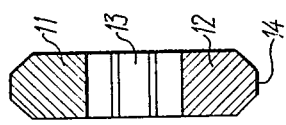
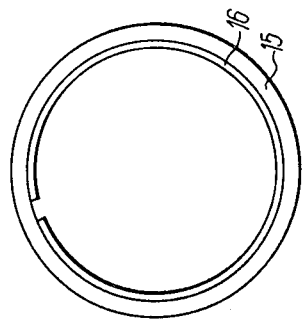

TUBULAR THERMOELECTRIC MODULE

The present invention relates to the art of direct convertion of thermal energy to electric energy and, more particularly, to thermoelectric modules.

The main components of thermoelectric generators known in the art are modules of flat thermopiles provided with electric insulation and enclosed in a sealed case filled with inert gas. The case can be provided with thin-walled covers fixed between solid plates (inner and outer thermal conductors) to supply and drain off the heat flow, whereupon a high pressing force is required for reducing the losses in thermal head across thermal contact joints which, in turn, leads to an increase in weight of the module, complication of assembly and difficulties in attaining rather small thermal stresses in the thermopiles at heating of the hot thermal conductor.

In other prior-art modules, the case covers are solid structures operating as thermal conductors, with each thermoelement forming a thermopile pressed against one of the covers by means of springs mounted inside the case. This type of module provides for substantial reduction of thermal stresses and losses in the thermal head, but suffers from a disadvantage residing in intricate construction and high price of manufacture.

Known in the art is a tubular thermoelectric module devised by the Westinghouse Electric Corporation and described in Proc. 4th Intersoc Energy Couvers Eng. Conf. Washington DC, 1969, New York, 1969, 300–307).

It consists of an inner and an outer thermal conductors of circular thermopiles incorporating p- and n-sides and embracing the inner thermal conductor; electric insulation units; and strips interconnecting the thermopiles. The p- and n-sides formed by unbroken rings seated on the inner thermal conductor and interconnected on the inner and outer surfaces by metal rings, constitute a cylindrical thermopile. The insulation units insulate the thermopiles from one another and from the outer and inner thermal conductors. To reduce the losses in the thermal head at the contact joints between the thermal conductors, electric insulation units and cylindrical thermopile, the thermal conductors are crimped for the purpose of producing a pressing force acting on said elements.

The above mentioned module has a number of considerable disadvantages:

1. At heating of the module, the inner and outer thermal conductors do not elongate identically due to a difference in operating temperatures, which brings about a shearing stress in the thermopile material, hence, the module length must be limited. Structural elements fitted at the end faces of the module for reducing the shearing stress provide for an axial pressure. However, with said elements employed, the length of the module can not exceed 30 to 40 cm. Besides, said elements cause shunting of the thermal flux from the hot thermal conductor to the cold thermal conductor, which leads to a decrease in the efficiency.

2. When the thermal conductors are pressed against the p- and n-sides of the thermopiles by crimping, equal diameters of the conductors cannot be obtained by the manufacturing method, and the pressing force in a number of p- and n-sides turns to be too low, which leads to a decrease in the efficiency and power of the module due to added losses in the thermal head across the contact joints of said sides.

3. To reduce the thermal stress on the boundaries between the thermopiles and thermal conductors, a high degree of finish of mating surfaces must be ensured, which results in complication of the manufacturing procedure. In this case, however, even minute surface irregularities cause a substantial difference in temperatures at said boundary, hence, the efficiency of the module drops.

It is an object of the present invention to improve the reliability, efficiency and power of the tubular thermoelectric module by elimination of the shearing stresses occuring in the thermoelectric material, and by reducing the losses in the thermal head across the contact joints between the thermal conductors, thermopiles and electric insulation units, to achieve a higher specific power by providing thermopiles of optimum shape, and to establish reliable connections of the thermopiles by means of closely-fixed contacts.

This object is accomplished in a tubular thermoelectric module consisting of an inner and an outer thermal conductors; circular thermopiles embracing the inner thermal conductors; electric insulation units which insulate one thermopile from another and from the inner and outer thermal conductors; and connecting strips which interconnect the thermopiles; with the outer thermal conductor contrived, according to the invention, in the form of a number of sealed taper clamps, each embracing a respective thermopile.

It is expedient that said taper clamp is made of an unbroken outer ring and a split inner ring.

It is also expedient that the inner diameter of the taper clamps is less than the minimum outer diameter of the circular thermopiles.

It is also expedient that the outer ring of the taper clamp is made of titanium.

It is furthermore expedient that the inner rings of the taper clamp is made from a metal with a low yield point (eg. aluminium).

It is desirable to seal the taper clamps by means of a thin-walled corregated metal jacket fitted around the taper clamps and provided with corrugations located in the gaps between said taper clamps.

It is desirable that the axial sections of the circular thermopiles are shaped trapezoidally for increasing the specific power.

It is still preferable that the connecting strips are pressed against the thermopiles by means of said taper clamps for the purpose of improving the reliability.

The tubular thermoelectric module of the present invention provides for a high specific power, high efficiency, resistance to mechanical and thermal shocks, and low production costs. The length of the module is practically unlimited. Owing to a wide range of application and simplicity of arrangement, the module can be employed in generators operating on organic fuel and in the sources utilizing geothermal energy, solar radiation and nuclear energy.

The nature of the present invention will be clear from the following description of an embodiment of the invention taken in conjunction with the accompanying drawings, wherein:

FIG. 1 is a longitudinal cut-away section view of an embodiment of the tubular thermoelectric module;

FIG. 2 is an end view of a circular thermopile;

FIG. 3 is a longitudinal section of said circular thermopile;

FIG. 4 is an end view of a taper clamp;

FIG. 5 is a longitudinal section view of said taper clamp.

Referring now to FIG. 1, the tubular thermoelectric module of the present invention comprises an inner thermal conductor 1 with flexible circular thermopiles 2 seated thereon, and with taper clamps 3 embracing the thermopiles 2; electric insulation units 4, 5 and 6 serving to insulate one thermopile 2 from another, and from the inner thermal conductor 1 and taper clamps 3; sealing jacket 7; and covers 8 incorporating current leads 9. The taper clamps 3 and the sealing jacket 7 constitute an outer thermal conductor. Covers 8 are welded to the thermal conductor 1 and to the sealing jacket 7. Thus, the inner thermal conductor 1, sealing jacket 7 and covers 8 form a sealed space, wherein the thermopiles 2 are enclosed. The sealed current leads 9 are provided with holes (not shown in the drawing) to permit evacuation of the internal space of the module and filling it with inert gas. To interconnect the thermopiles 2 and to connect them to the current leads, use is made of flexible connecting strips 10 arranged in parallel with the axis of the module. Said connecting strips 10 contact the thermopiles 2 because they are clamped thereto by the taper clamps 3 (without soldering).

The circular thermopiles 2 are illustrated in FIGS. 2 and 3. Each circular thermopile 2 comprises p- and n-sides 11 and 12 in the form of ring sections interconnected in series circumferentially on hot and cold sides by means of connecting busbars 13 and 14. Owing to flexibility of the busbars and gaps existing between sides 11 and 12, the thermopile 2 is sufficiently flexible to translate the pressure. The outer side of the thermopile 2 is shaped trapezoidally in the axial section. The gaps beside the outer thermal conductor formed by the thermopiles of said shape accommodate flexible connecting strips 10 whereas the inner sections of the thermopiles 2 are fitted closely together.

The taper clamps are illustrated in FIGS. 4 and 5. Each taper clamp cousists of an unbroken outer ring 15 and a split inner ring 16. The mating surfaces of said rings 15 and 16 are inclined at an angle less than the angle of friction of the material from which the rings are manufactured. The mean thickness of the outer ring 15 is given by the formula:

$$\delta = \frac{PR}{\sigma T},$$

where P is the rated pressing force which is somewhat below the compression strength of the thermoelectric material, $\delta_T$ is the yield limit of the material of which the outer ring is made, and R is the radius of the outer ring. The inner diameter $D_o$ of the taper ring 3 must be less than the minimum diameter $D_{min}$ of the circular thermopiles $$2\left(\frac{D_o}{D_{min}}\right) \leq 1 = \frac{\sigma T}{E},$$

where E is the elastic modulus) which is essential for plastic deformation of rings 15 press-fitted to a position closely aligned with the rings 16 seated on the thermopile 2, irrespective of variation of the diameters of the thermopiles 2 in manufacture. It is preferable to make the rings 15 of titanium capable of considerable plastic deformation and possessing a low elastic modulus.

It is advisable that the split rings 16 be made of metals with low yield limits (such as aluminium and copper). Since in press-fitting of the outer ring 15, the inner ring 16 deforms plastically in the areas of minute surface irregularities on the mated surfaces, close contact is achieved, hence, the thermal contact resistances are low.

It is possible that the electric insulation units 4, 5 and 6 be made from any suitable materials (eg. mica, ceramics, etc.).

The sealing jacket 7 in the form of a cylinder is made of thin metal foil. The annular corrugations of the jacket 3 located in the gaps between the clamps 3 serve to permit shrinking (or stretching) of the cylindrical sections of the jacket 7 for close fitting to the taper clamps 3. The jacket is attached to the clamps by spot welding.

The module operates as follows.

When hot heat-carrying agent flows through the inner thermal conductor 1 while the cold heat carrier flows in the space surrounding the outer thermal conductor, produced by the taper clamps 3 and by the sealing jacket 7, the thermal flow moves in a radial direction through the thermopiles 2 and insulation units 5 and 6. The voltage produced by the thermopiles 2 is supplied through the current leads to a load (not shown in the drawing). At heating, the inner thermal conductor 1 elongates, and the spaces between the thermopiles 2 rigidly connected to the thermal conductor 1 are caused to widen, so that the corrugations of the sealing jacket 7 and the flexible connecting strips between the thermopiles 2 stretch, thereby preventing a hazardous shear stress in the material of which the thermopiles 2 are made.

What is claimed is:

1. A tubular thermoelectric module comprising an inner thermal conductor; circular thermopiles embracing said inner thermal conductor; connecting strips interconnecting said thermopiles; an outer thermal conductor in the form of a number of taper clamps, each of said taper clamps including an unbroken outer ring and a split inner ring, each embracing a respective one of said thermopiles; and electric insulation units serving to insulate one thermopile from another and from said inner and outer thermal conductors.

2. A tubular thermoelectric module as claimed in claim 1, wherein the inner diameter of said taper clamps is less than the minimum outer diameter of said thermopiles, said thermopiles being compressible.

3. A tubular thermoelectric module as claimed in claim 1, wherein said taper clamp has an outer ring, said outer ring being made of titanium.

4. A tubular thermoelectric module as claimed in claim 1, wherein said inner ring of said taper clamp is made of aluminium.

5. A module as claimed in claim 1, wherein said taper clamps are sealed with a thin-walled corrugated jacket embracing said taper clamps, the corrugations thereof are fitted into gaps between said taper clamps.

6. A tubular thermoelectric module as claimed in claim 1, wherein the axial sections of said circular thermopiles are shaped trapezoidally on the outer side.

7. A tubular thermoelectric module as claimed in claim 1, wherein said connecting strips are pressed against said circular thermopiles with said taper clamps.

* * * * *